(12) United States Patent
Zhang et al.

(10) Patent No.: US 12,690,187 B2
(45) Date of Patent: Jul. 21, 2026

(54) MEMORY DEVICE AND MANUFACTURING METHOD THEREOF

(71) Applicant: Fujian Jinhua Integrated Circuit Co., Ltd., Quanzhou City (CN)

(72) Inventors: Janbo Zhang, Quanzhou City (CN); Li-Wei Feng, Quanzhou City (CN); Yu-Cheng Tung, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 520 days.

(21) Appl. No.: 18/129,093

(22) Filed: Mar. 31, 2023

(65) Prior Publication Data

US 2024/0298436 A1 Sep. 5, 2024

(30) Foreign Application Priority Data

Mar. 2, 2023 (CN) .......................... 202310192984.7
Mar. 2, 2023 (CN) .......................... 202320370413.3

(51) Int. Cl.
*H10B 12/00* (2023.01)
(52) U.S. Cl.
CPC ........... *H10B 12/482* (2023.02); *H10B 12/02* (2023.02)
(58) Field of Classification Search
CPC ... H10B 12/02; H10B 12/0335; H10B 12/482
See application file for complete search history.

(56) References Cited

U.S. PATENT DOCUMENTS

| | | | |
|---|---|---|---|
| 9,460,964 B2 | 10/2016 | Kim | |
| 10,957,647 B2 | 3/2021 | Lee | |
| 12,057,396 B2 | 8/2024 | Hyung | |
| 2022/0059543 A1* | 2/2022 | Mun | ..................... H10B 12/34 |
| 2022/0208772 A1 | 6/2022 | Ping | |

FOREIGN PATENT DOCUMENTS

| | | |
|---|---|---|
| CN | 111640744 A | 9/2020 |
| CN | 114256244 A | 3/2022 |

* cited by examiner

*Primary Examiner* — Britt Hanley
*Assistant Examiner* — Kevin Quinto
(74) *Attorney, Agent, or Firm* — Winston Hsu

(57) ABSTRACT

A memory device and a manufacturing method thereof are disclosed in the present invention. The memory device includes a semiconductor substrate, bit line structures, isolation structures, a storage node contact structure, and first voids. The bit line structures, the isolation structures, and the storage node contact structure are disposed on the semiconductor substrate. Each bit line structure extends in a first direction, and the bit line structures are arranged in a second direction. The isolation structures are located between the bit line structures adjacent to one another. The storage node contact structure is located between two adjacent bit line structures and located between two adjacent isolation structures in the first direction. The storage node contact structure includes four corner portions. The first voids are disposed in the storage node contact structure, and the first voids are located in at least two of the four corner portions.

30 Claims, 12 Drawing Sheets

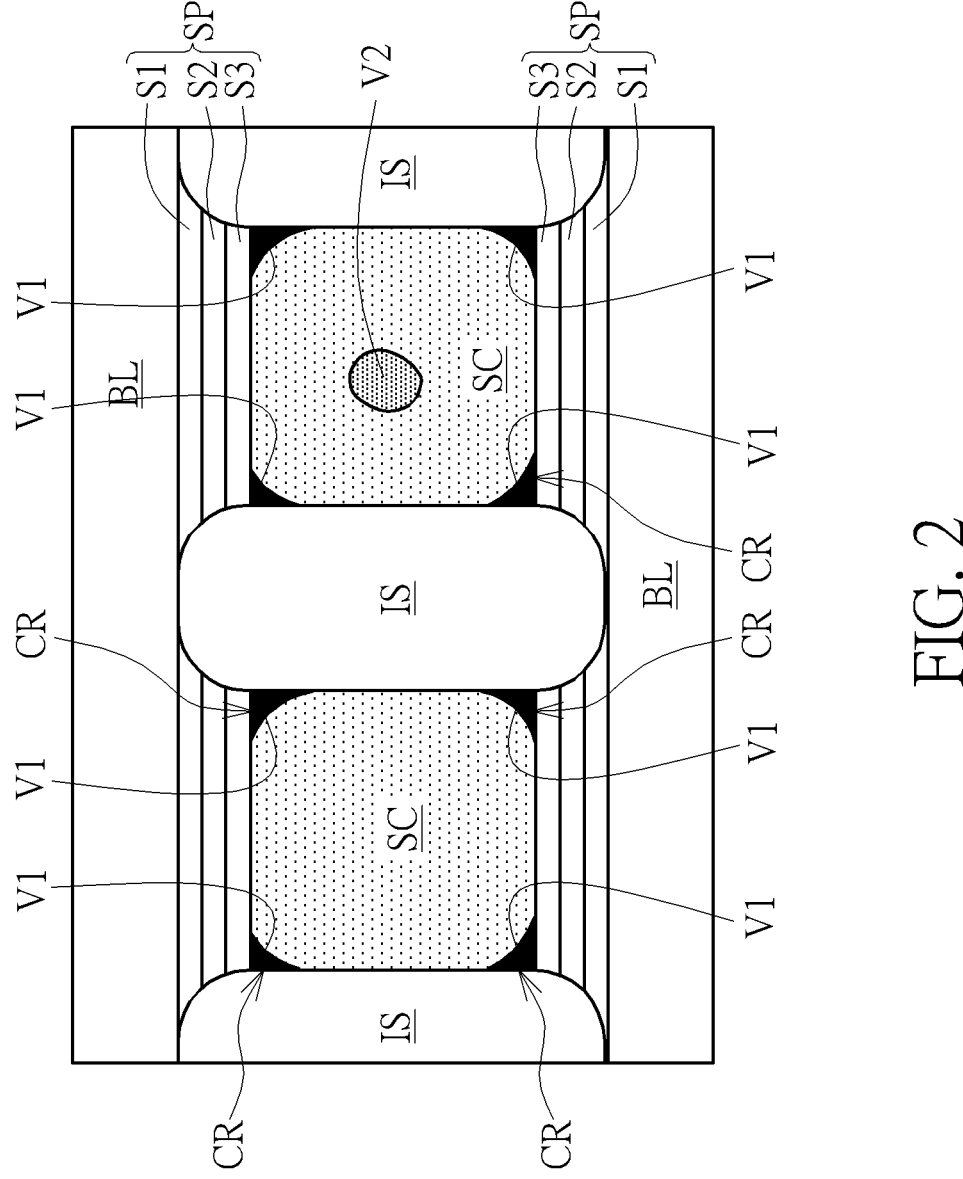
FIG. 2
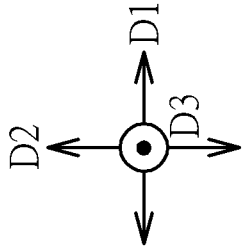

MEMORY DEVICE AND MANUFACTURING METHOD THEREOF

BACKGROUND OF THE INVENTION

1. Field of the Invention

The present invention relates to a memory device and a manufacturing method thereof, and more particularly, to a memory device including a storage node contact structure with a void inside and a manufacturing method thereof.

2. Description of the Prior Art

The memory device, such as dynamic random access memory (DRAM), generally includes a storage capacitor and a storage transistor electrically connected with the storage capacitor. The storage capacitor is used to store electric charge as information, and the storage transistor may be electrically connected with the storage capacitor via a storage node contact structure. For product demands, the density of memory cells needs to be continuously increased, resulting in increasing difficulty and complexity in related manufacturing processes and designs and resulting in increased production costs. Therefore, the production efficiency needs to be enhanced and the production cost needs to be reduced still by improving structural design and/or manufacturing process.

SUMMARY OF THE INVENTION

A memory device and a manufacturing method thereof are provided in the present invention. Voids are formed in a storage node contact structure, and the voids are located in at least two of four corner portions of the storage node contact structure for reducing negative influence of the voids on the storage node contact structure while increasing the manufacturing throughput.

According to an embodiment of the present invention, a memory device is provided. The memory device includes a semiconductor substrate, bit line structures, isolation structures, a storage node contact structure, and first voids. The bit line structures, the isolation structures, and the storage node contact structure are disposed on the semiconductor substrate. Each of the bit line structures extends in a first direction, and the bit line structures are arranged in a second direction. The isolation structures are located between the bit line structures adjacent to one another. The storage node contact structure is located between two of the bit line structures adjacent to each other, and the storage node contact structure is located between two of the isolation structures adjacent to each other in the first direction. The storage node contact structure includes four corner portions, the first voids are disposed in the storage node contact structure, and the first voids are located in at least two of the four corner portions respectively.

According to an embodiment of the present invention, a manufacturing method of a memory device is provided. The manufacturing method includes the following steps. Bit line structures are formed on a semiconductor substrate. Each of the bit line structures extends in a first direction, and the bit line structures are arranged in a second direction. Isolation structures are formed on the semiconductor substrate, and the isolation structures are located between the bit line structures adjacent to one another. A storage node contact structure is formed on the semiconductor substrate, the storage node contact structure is located between two of the bit line structures adjacent to each other, and the storage node contact structure is located between two of the isolation structures adjacent to each other in the first direction. The first voids are formed in the storage node contact structure, the storage node contact structure includes four corner portions, and the first voids are located in at least two of the four corner portions respectively.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a partially enlarged top view schematic drawing illustrating a memory device according to an embodiment of the present invention.

FIG. 5, FIG. 6, FIG. 7, FIG. 8, FIG. 9, FIG. 10, FIG. 11, and FIG. 12 are schematic drawings illustrating a manufacturing method of a memory device according to an embodiment of the present invention, wherein FIG. 6 is a cross-sectional schematic drawing taken in another direction in the situation of FIG. 5, FIG. 7 is a schematic drawing in a step subsequent to FIG. 5, FIG. 8 is a schematic drawing in a step subsequent to FIG. 7, FIG. 9 is a schematic drawing in a step subsequent to FIG. 8, FIG. 10 is a cross-sectional schematic drawing taken in another direction in the situation of FIG. 9, FIG. 11 is a schematic drawing in a step subsequent to FIG. 9, and FIG. 12 is a schematic drawing in a step subsequent to FIG. 10.

DETAILED DESCRIPTION

To provide a better understanding of the presented invention, preferred embodiments will be described in detail. The preferred embodiments of the present invention are illustrated in the accompanying drawings with numbered elements. In addition, the technical features in different embodiments described in the following may be replaced, recombined, or mixed with one another to constitute another embodiment without departing from the spirit of the present invention.

Figure 1:
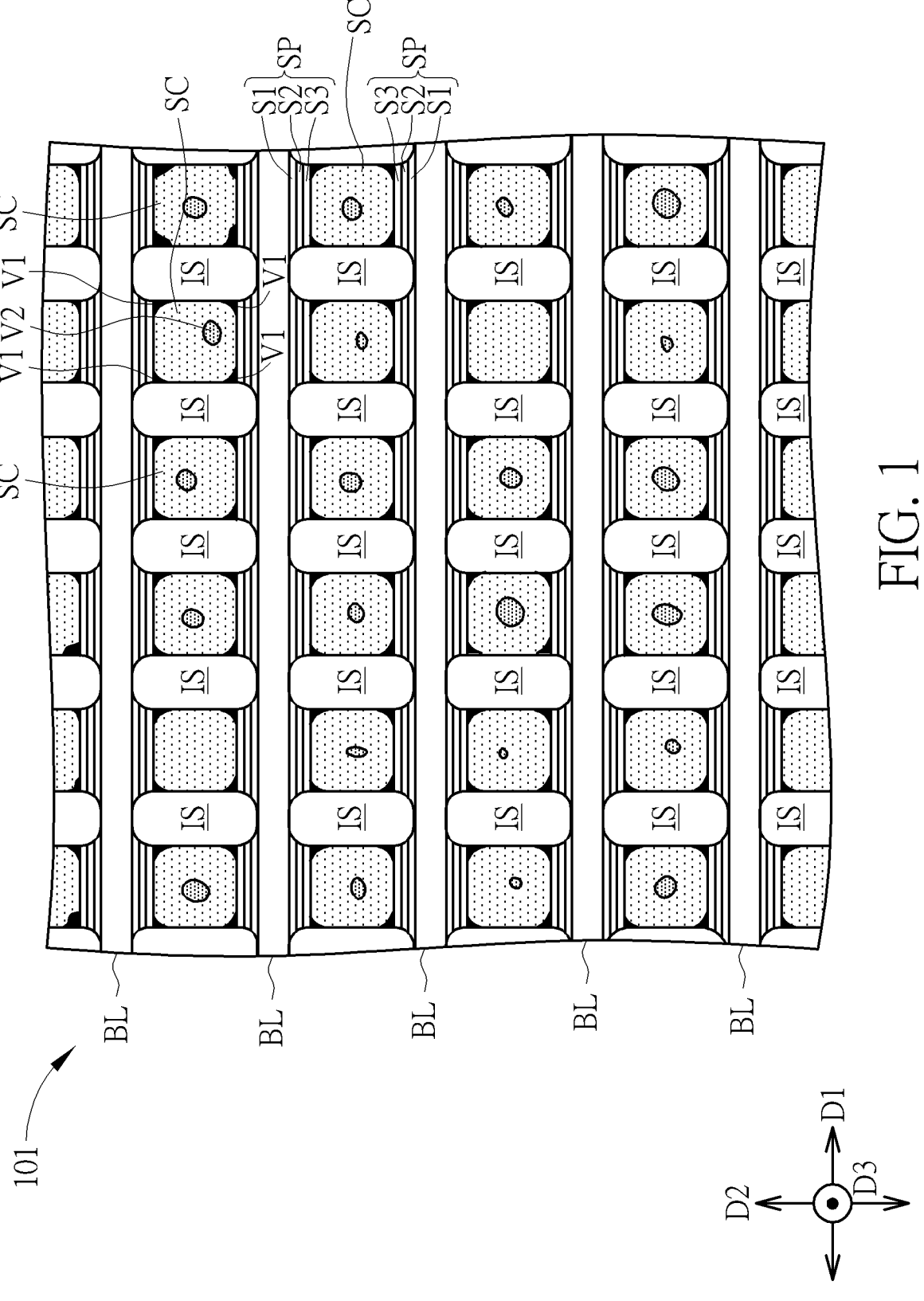
FIG. 1 is a top view schematic drawing illustrating a memory device according to an embodiment of the present invention.
Figure 3:
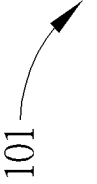
FIG. 3 is a cross-sectional schematic drawing illustrating a memory device according to an embodiment of the present invention.
Figure 3:
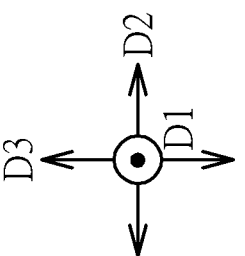
Figure 4:
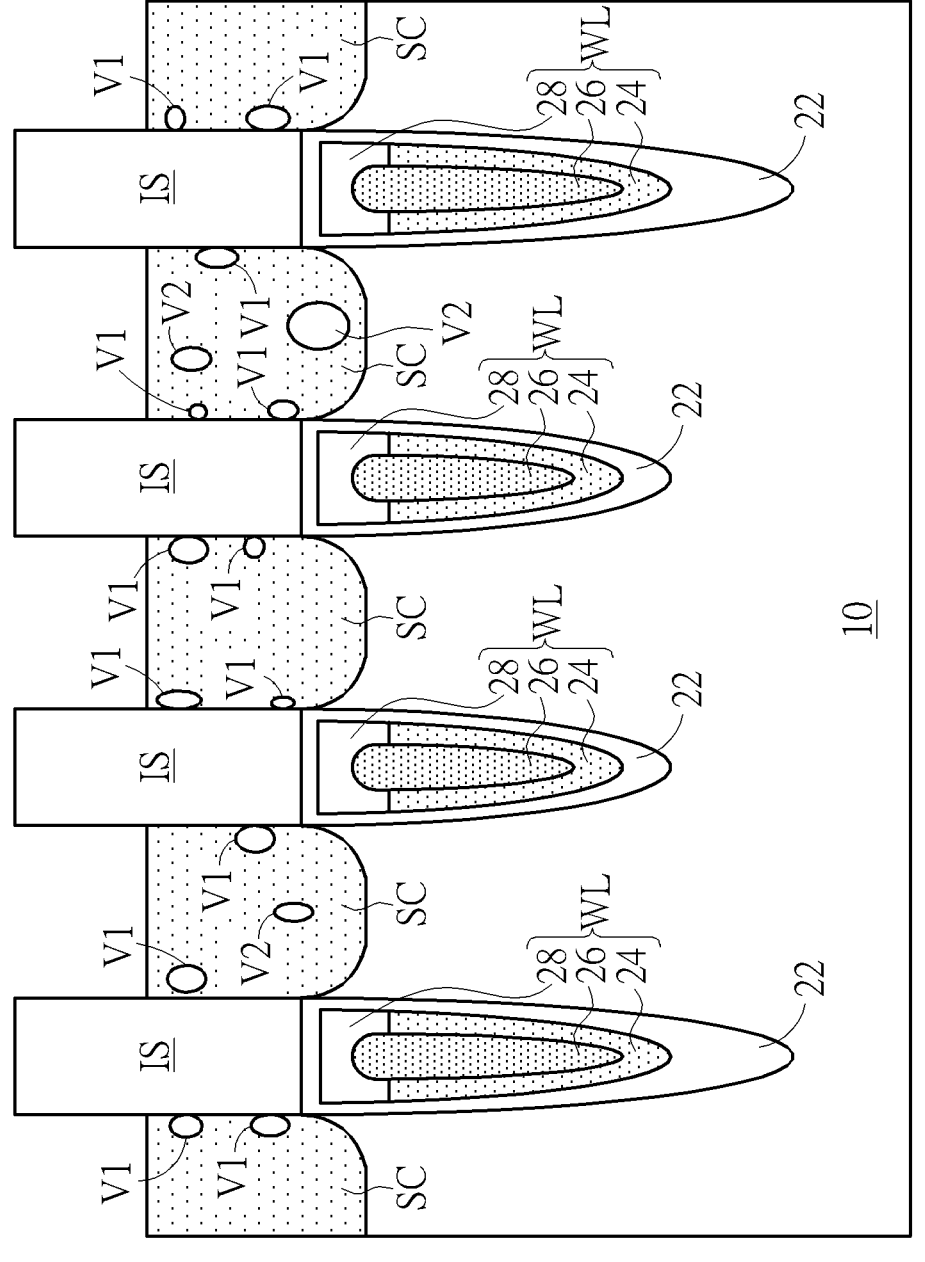
FIG. 4 is another cross-sectional schematic drawing illustrating a memory device according to an embodiment of the present invention.
Figure 4:
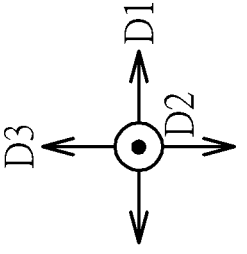

Please refer to FIGS. 1-4. FIG. 1 is a top view schematic drawing illustrating a memory device 101 according to an embodiment of the present invention, FIG. 2 is a partially enlarged top view schematic drawing illustrating the memory device in this embodiment, FIG. 3 is a cross-sectional schematic drawing illustrating the memory device 101 in this embodiment, and FIG. 4 is another cross-sectional schematic drawing illustrating the memory device 101 in this embodiment. In some embodiments, FIG. 3 may be regarded as a cross-sectional schematic drawing taken along a vertical cross-sectional line (such as a cross-sectional line parallel with a second direction D2 illustrated in FIG. 1), and FIG. 4 may be regarded as a cross-sectional schematic drawing taken along a horizontal cross-sectional line (such as a cross-sectional line parallel with a first direction D1 illustrated in FIG. 1), but not limited thereto. As shown in FIGS. 1-4, the memory device 101 includes a semiconductor substrate 10, a plurality of bit line structures BL, a plurality of isolation structures IS, a storage node contact structure SC, and a plurality of first voids V1. The bit line structures BL, the isolation structures IS, and the storage node contact structure SC are disposed on the semiconductor substrate 10. Each of the bit line structures BL extends in a first direction D1, and the bit line structures are arranged repeatedly in a second direction D2. In some embodiments, the second direction D2 may be substantially orthogonal to the first direction D1, but not limited thereto. The isolation structures IS are located between the bit line structures BL adjacent to one another. The storage node contact structure SC is located between two of the bit line structures BL adjacent to each other, and the storage node contact structure SC is located between two of the isolation structures IS adjacent to each other in the first direction D1. The storage node contact structure SC includes four corner portions CR, the first voids V1 are disposed in the storage node contact structure SC, and the first voids V1 are located in at least two of the four corner portions CR respectively. The contact condition between the storage node contact structure SC and the semiconductor substrate 10 (such as a source/drain region formed in the semiconductor substrate 10, not illustrated) will not be influenced by the first voids V1 because the first voids V1 are located in the corner portions CR of the storage node contact structure SC. Therefore, the voids are allowed to be formed in the storage node contact structure SC while maintaining the function of the storage node contact structure SC, the storage node contact structure SC may be formed by a faster manufacturing process accordingly, and the throughput of the related manufacturing equipment may be improved, the manufacturing capacity may be enhanced, and/or the manufacturing cost may be reduced relatively.

In some embodiments, the memory device 101 may include a plurality of the storage node contact structures SC, and the storage node contact structures SC may be arranged in an array configuration along the first direction D1 and the second direction D2, but not limited thereto. The storage node contact structures SC and the isolation structures IS may be disposed alternately in the first direction D1, the storage node contact structures SC and the bit line structures BL may be disposed alternately in the second direction D2, and each of the isolation structures IS may be located between two of the storage node contact structures SC adjacent to each other in the first direction D1. Each of the corner portions CR of each storage node contact structure SC may be disposed and surrounded by one of the two adjacent isolation structures IS located corresponding to this storage node contact structure SC and one of the two adjacent bit line structures BL located corresponding to this storage node contact structure SC. In some embodiments, the first direction D1 and the second direction D2 may be regarded as horizontal directions, and a vertical direction D3 orthogonal to the first direction D1 and the second direction D2 may be regarded as a thickness direction of the semiconductor substrate 10. The semiconductor substrate 10 may have a top surface and a bottom surface opposite to the top surface in the vertical direction D3, and the bit line structures BBL, the isolation structures IS, and the storage node contact structures SC may be at least partially disposed on the top surface of the semiconductor substrate 10. In this description, a distance between the bottom surface of the semiconductor substrate 10 and a relatively higher location and/or a relatively higher part in the vertical direction D3 may be greater than a distance between the bottom surface of the semiconductor substrate 10 and a relatively lower location and/or a relatively lower part in the vertical direction D3. The bottom or a lower portion of each component may be closer to the bottom surface of the semiconductor substrate 10 in the vertical direction D3 than the top or upper portion of this component. Another component disposed above a specific component may be regarded as being relatively far from the bottom surface of the semiconductor substrate 10 in the vertical direction D3, and another component disposed under a specific component may be regarded as being relatively close to the bottom surface of the semiconductor substrate 10 in the vertical direction D3. Additionally, in this description, a top surface of a specific component may include the topmost surface of this component in the vertical direction D3, and a lower surface of a specific component may include the bottommost surface of this component in the vertical direction D3, but not limited thereto.

In some embodiments, the semiconductor substrate 10 may include a silicon substrate, an epitaxial silicon substrate, silicon germanium substrate, silicon carbide substrate, or silicon-on-insulator (SOI) substrate, but not limited thereto. Additionally, in some embodiments, the memory device 101 may further include a trench isolation structure 12 disposed in the semiconductor substrate 10 for defining active regions separated from one another in the semiconductor substrate 10. The source/drain region may be formed in the active region, and the storage node contact structure SC may be disposed correspondingly on the source/drain region for contacting and being electrically connected with the source/drain region. The trench isolation structure 12 may include a single layer or multiple layers of insulation materials, such as silicon nitride, silicon oxynitride, silicon carbonitride, or other suitable insulation materials. In addition, the memory device 101 may further include a plurality of word line structures WL, each of the word line structures WL may extend in the second direction D2, and the word line structures WL may be arranged repeatedly in the first direction D1. In some embodiments, the word line structure WL may be disposed and buried in the semiconductor substrate 10, and the word line structure WL may be regarded as a buried word line accordingly, but not limited thereto. Additionally, each of the word line structure WL may include a gate dielectric layer 22, a work function layer 24 disposed on the gate dielectric layer 22, an electrically conductive layer 26 disposed on the work function layer 24, and a cap layer 28 disposed on the work function layer 24 and the electrically conductive layer 26. The gate dielectric layer 22 may include a high dielectric constant (high-k) dielectric material or other suitable dielectric materials. The high-k dielectric material described above may include hafnium oxide ($HfO_X$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k dielectric materials.

The work function layer 24 may include titanium nitride, titanium carbide, tantalum nitride, tantalum carbide, tungsten carbide, titanium trialuminide, aluminum titanium nitride, or other suitable electrically conductive work function materials. The electrically conductive layer 26 may include tungsten, aluminum, copper, titanium aluminide, titanium, or other suitable electrically conductive materials with relatively low electrical resistivity. The capping layer 28 may include silicon nitride, silicon oxynitride, silicon carbonitride, or other suitable insulation materials.

In some embodiments, the memory device 101 may further include a plurality of first sidewall structures SP disposed on the semiconductor substrate 10. Each of the first sidewall structure SP may be disposed on a sidewall of the corresponding bit line structure BL, and each of the first sidewall structures SP may be sandwiched between the corresponding bit line structure BL and the corresponding storage node contact structure SC in the second direction D2. In addition, each of the corner portions CR of each storage node contact structure SC may directly contact one of the two adjacent isolation structures IS located corresponding to this storage node contact structure and/or one of the two first sidewall structures SP located corresponding to this storage node contact structure SC, but not limited thereto. In some embodiments, the first sidewall structure SP may include a multiple layer structure made of different insulation materials, but not limited thereto. For example, the first sidewall structure SP may include a sidewall spacer S1, a sidewall spacer S2, and a sidewall spacer S3 stacked in sequence from the sidewall of the bit line structure BL outwards along the second direction D2. The sidewall spacer S1, the sidewall spacer S2, and the sidewall spacer S3 may be a nitride insulation material, an oxide insulation material, and a nitride insulation material, respectively, or other combinations of the materials described above, but not limited thereto. In some embodiments, the memory device 101 may further include a plurality of bit line contact structures BC and a plurality of cap layers CL. Each of the bit line contact structures BC may be located between the semiconductor substrate 10 and the corresponding bit line structure BL in the vertical direction D3, and each of the cap layers CL may be located above the corresponding bit lint structure BL in the vertical direction D3. The bit line contact structure BC may include a non-metallic electrically conductive material, such as polysilicon, amorphous silicon, or other non-metallic electrically conductive materials including silicon or not. The cap layer CL may include silicon nitride, silicon oxynitride, silicon carbonitride, or other suitable insulation materials. The bit line structure BL may include an electrically conductive layer (not illustrated) and a barrier layer (not illustrated) located between the electrically conductive layer and the bit line contact structure BC. The electrically conductive layer in the bit line structure BL may include aluminum, tungsten, copper, titanium aluminide, or other suitable metal electrically conductive materials with low electrical resistivity, and the barrier layer in the bit line structure BL may include titanium, tungsten silicide, tungsten nitride, or other suitable electrically conductive barrier materials. The bit line structure BL may be electrically connected with a source/drain region in the semiconductor substrate via the bit line contact structure BC. The bit line structure BL and the storage node contact structure SC may be electrically connected with different source/drain regions located in the same active region, respectively, and a storage capacitor structure (not illustrated) may be electrically connected with the corresponding source/drain region via the storage node contact structure SC. In some embodiments, the memory device 101 may further include mask materials (such as a mask layer 32, a mask layer 34, and a mask layer 36 illustrated in FIG. 4) disposed between the bit line contact structure BC and the semiconductor substrate 10 in the vertical direction D3 for providing an electrically isolation effect between the bit line contact structure BC and the active region which is not designed corresponding to this bit line contact structure BC.

In some embodiments, the isolation structure IS may include a nitride insulation material or other suitable insulation materials, and the storage node contact structure SC may include a non-metallic electrically conductive material, such as polysilicon, amorphous silicon, or other non-metallic electrically conductive materials including silicon or not. In some embodiments, the first voids V1 may be located in the four corner portions CR of the storage node contact structure SC, respectively, and the first voids V1 may be separated from one another without being directly connected with each other for avoiding the first void becoming too large and influencing the structural strength and/or the electrically conductive effect of the storage node contact structure SC. In addition, the first void V1 located in the corner portion CR may directly contact one of the two adjacent isolation structures IS and/or one of the two adjacent first sidewall structures SP, but not limited thereto. In some embodiments, the memory device 101 may further include a second void V2 disposed in the storage node contact structure SC and separated from the first voids V1. The second void V2 may be disposed in a position within the storage node contact structure SC away from the corner portions CR of the storage node contact structure SC. The first voids V1 and the second void V2 are not directly connected with the semiconductor substrate 10 and/or the source/drain region in the semiconductor substrate 10 for avoiding influencing the contact condition between the storage node contact structure SC and the source/drain region in the semiconductor substrate 10. In some embodiments, the first void V1 and the second void V2 may include air gaps, respectively, or other types of void structures, and the second void V2 may be greater than the first void V1, but not limited thereto.

Figure 5:
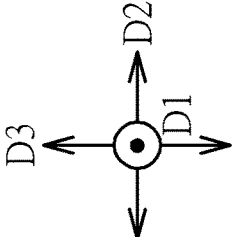
Figure 6:
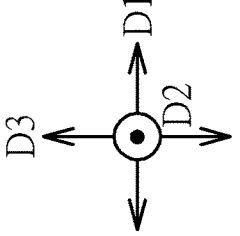

Please refer to FIGS. 1-6. FIG. 5 and FIG. 6 are schematic drawings illustrating a manufacturing method of a memory device according to an embodiment of the present invention, wherein FIG. 5 may be regarded as a schematic drawing in a step before FIG. 3, and FIG. 6 may be regarded as a schematic drawing in a step before FIG. 4. As shown in FIGS. 1-4, a manufacturing method of a memory device is provided in an embodiment of the present invention, and the manufacturing method includes the following steps. The bit line structures BL are formed on the semiconductor substrate 10. Each of the bit line structures BL extends in the first direction D1, and the bit line structures BL are arranged in the second direction D2. The isolation structures IS are formed on the semiconductor substrate 10, and the isolation structures IS are located between the bit line structures BL adjacent to one another. The storage node contact structure SC is formed on the semiconductor substrate 10, the storage node contact structure SC is located between two of the bit line structures BL adjacent to each other, and the storage node contact structure SC is located between two of the isolation structures IS adjacent to each other in the first direction D1. The first voids V1 are formed in the storage node contact structure CS, the storage node contact structure SC includes four corner portions CR, and the first voids V1 are located in at least two of the four corner portions CR respectively.

In some embodiments, a method of forming the storage node contact structure SC may include but is not limited to the following steps. As shown in FIG. 5 and FIG. 6, after the bit line structures BL and the isolation structures IS are formed, a part of the semiconductor substrate 10 (such as a part of a source/drain region in the semiconductor substrate 10) may be exposed by etching downwards at the area surrounded by the bit line structures BL and the isolation structures IS. Subsequently, an epitaxial growth process 91 may be performed for forming an electrically conductive epitaxial material 40 on the semiconductor substrate 10. A portion of the electrically conductive epitaxial material 40 may cover each bit line structure BL, each cap layer CL, each first sidewall structure SP, and each isolation structure IS, and the space surrounded by the bit line structures BL and the isolation structures IS may be filled with another portion of the electrically conductive epitaxial material 40. Subsequently, an etching back process may be performed to the electrically conductive epitaxial material 40 for removing a part of the electrically conductive epitaxial material 40 and forming the storage node contact structures SC in the space surrounded by the bit line structures BL and the isolation structures IS as illustrated in FIG. 3 and FIG. 4. It is worth noting that the first voids V1 and the second voids V2 may be formed in the epitaxial growth process 91 illustrated in FIG. 5 and FIG. 6 and formed in the electrically conductive epitaxial material 40 by the epitaxial growth process 91. The first voids V1 and the second voids V2 may not be formed and directly connected with the semiconductor substrate 10 and/or the source/drain region in the semiconductor substrate 10 by controlling the process conditions of the epitaxial growth process 91. For example, the variation of the growing rate of the epitaxial growth process 91 may be controlled. The process conditions for lower growing rate may be applied in the front section of the epitaxial growth process 91 for voiding forming voids at the bottommost part of the electrically conductive epitaxial material 40, and the process conditions for higher growing rate may be applied in the middle section and the back section of the epitaxial growth process 91 for completing the formation of the electrically conductive epitaxial material 40, for instance, but not limited thereto. In some embodiments, the process conditions with relatively low process temperature may be applied in the front section of the epitaxial growth process 91 for achieving lower growing rate, and the process conditions with relatively high process temperature may be applied in the back section of the epitaxial growth process 91 for achieving higher growing rate, but not limited thereto. In some embodiments, the voids in the electrically conductive epitaxial material 40 and the storage node contact structure SC may be controlled and adjusted by other suitable approaches also (such as an annealing process performed after the epitaxial growth process 91, but not limited thereto).

The following description will detail the different embodiments of the present invention. To simplify the description, the following description will detail the dissimilarities among different embodiments and the identical features will not be redundantly described. In addition, identical components in each of the following embodiments of the present invention are marked with identical symbols for making it easier for comparing the embodiments more conveniently.

Figure 7:
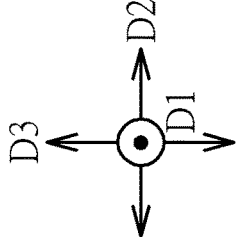
Figure 8:
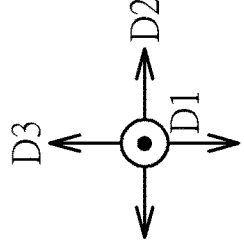
Figure 9:
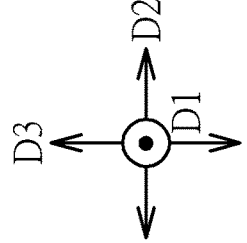
Figure 10:
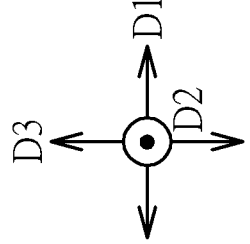
Figure 11:
Figure 11:
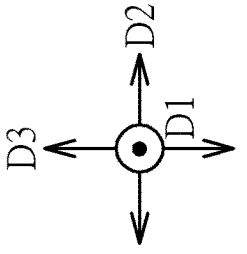
Figure 12:
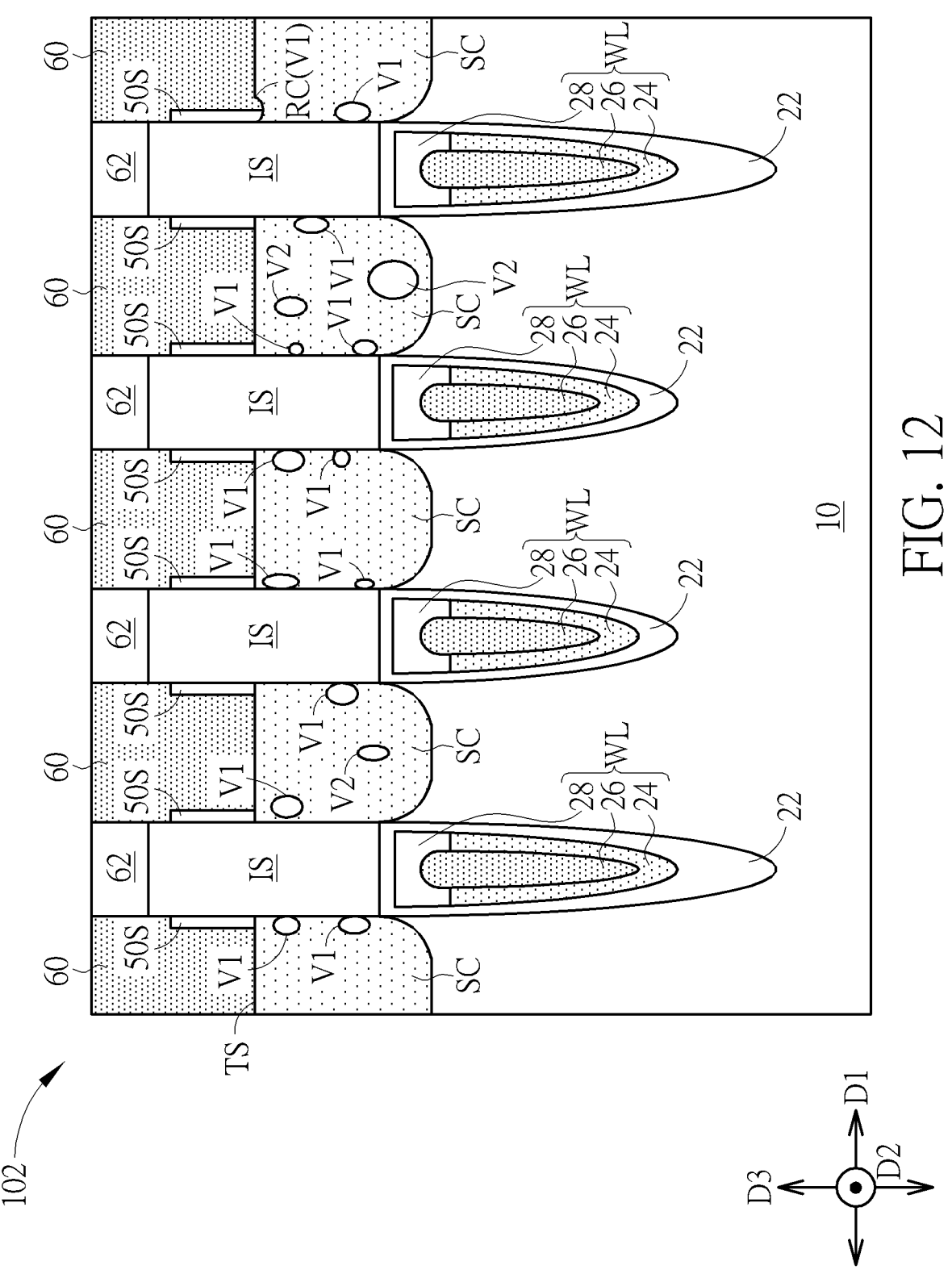

Please refer to FIGS. 5-12. FIGS. 5-12 are schematic drawings illustrating a manufacturing method of a memory device according to another embodiment of the present invention, wherein FIG. 6 is a cross-sectional schematic drawing taken in another direction in the situation of FIG. 5, FIG. 7 is a schematic drawing in a step subsequent to FIG. 5, FIG. 8 is a schematic drawing in a step subsequent to FIG. 7, FIG. 9 is a schematic drawing in a step subsequent to FIG. 8, FIG. 10 is a cross-sectional schematic drawing taken in another direction in the situation of FIG. 9, FIG. 11 is a schematic drawing in a step subsequent to FIG. 9, and FIG. 12 is a schematic drawing in a step subsequent to FIG. 10. In addition, FIG. 11 may be regarded as a cross-sectional schematic drawing illustrating a memory device 102 according to another embodiment of the present invention, and FIG. 12 may be regarded as a cross-sectional schematic drawing illustrating the memory device 102 and taken in another direction. As shown in FIGS. 5-7, after the step of forming the electrically conductive epitaxial material 40 by the epitaxial growth process 91, an etching back process 92 may be performed to the electrically conductive epitaxial material 40 for removing a part of the electrically conductive epitaxial material 40 and forming the storage node contact structures SC in the space surrounded by the bit line structures BL and the isolation structures IS. The first voids V1 and the second voids V2 may be formed in the electrically conductive epitaxial material 40 by the epitaxial growth process 91, and at least some of the first voids V1 and/or at least some of the second voids V2 may be located in the storage node contact structures SC after the etching back process 92. In some embodiments, some of the first voids V1 may be located at a position in the electrically conductive epitaxial material 40 near a position where the etching back process 92 stops, and the first void V1 encompassed by the electrically conductive epitaxial material 40 originally may be exposed by the etching back process 92 and become a recess RC. In other words, at least one of the first voids V1 may become a recess RC extending downwards from a top surface TS of the storage node contact structure SC after the etching back process 92, and a bottom of the recess RC may be lower than the top surface TS of the storage node contact structure SC in the vertical direction.

Subsequently, as shown in FIGS. 8-10, a second sidewall structure 50S may be formed on the storage node contact structure SC, and the second sidewall structure 50S may formed on sidewalls of the two adjacent isolation structures IS and sidewalls of the two adjacent bit line structures BL (such as sidewalls of the two adjacent first sidewall structures SP). In some embodiments, an insulation material 50 may be formed conformally on the storage node contact structures SC, the first sidewall structures SP, the cap layers CL, and the isolation structures IS, and an etching back process may be performed to the insulation material 50 so as to form the second sidewall structures 50S. In other words, the second sidewall structures 50S may be the insulation material 50 remaining on the storage node contact structures SC after the etching back process is performed to the insulation material 50, and the insulation material 50 may include nitride (such as silicon nitride) or other suitable insulation materials. In some embodiments, the recess RC described above may be filled with the insulation material 50, and the second sidewall structure 50S may be partially located in the recess RC. A width of the recess RC may be less than or equal to a width of the second sidewall structure 50, the recess RC may be completely filled with the second sidewall structure 50S, and the lower surfaces of the second sidewall structure 50S are not located in the same level accordingly. For example, a lower surface of the second sidewall structure 50S located in the recess RC may be lower than a lower surface of the second sidewall structure 50S located on the top surface TS of the storage node contact structure SC in the vertical direction D3, and a bottom of the second sidewall structure 50S (such as the lower surface of the second sidewall structure 50S) may be lower than a top of the storage node contact structure SC (such as the top surface TS) in the vertical direction D3. Additionally, in some embodiments, a width of the recess RC (such as a length of the recess RC in the first direction D1 or a length of the recess RC in the second direction D2) may be greater than a width of the second sidewall structure 50S (such as a length of the second sidewall structure 50S in the first direction D1 or a length of the second sidewall structure 50S in the second direction D2), and the recess RC is not fully filled with the second sidewall structure 50S under this situation.

As shown in FIGS. 9-12, after the step of forming the second sidewall structures 50S, electrically conductive structures 60 and a dielectric layer 62 may be formed. The electrically conductive structure 60 may include aluminum, tungsten, copper, titanium aluminide, or other suitable electrically conductive materials with low electrical resistivity, and the dielectric layer 62 may include oxide, nitride, or other suitable dielectric materials. In some embodiments, the electrically conductive structure 60 may include a single layer of an electrically conductive material or multiple layers of electrically conductive materials, such as a multiple layer electrically conductive structure composed of cobalt silicide (CoSi), titanium, titanium nitride, and tungsten in a stacked configuration, but not limited thereto. The dielectric layer 62 may be formed on the isolation structures IS and the cap layers CL, and the electrically conductive structure 60 may be formed on the storage node contact structure SC, the second sidewall structure 50S, and the cap layer CL. When the width of the recess RC is greater than the width of the second sidewall structure 50S and the recess RC is not fully filled with the second sidewall structure 50S, the recess RC may be filled with at least two materials. For instance, the recess RC may be filled with a part of the second sidewall structure 50S and a part of the electrically conductive structure 60, but not limited thereto. In some embodiments, the storage node contact structure SC may be electrically connected with a storage capacitor structure (not illustrated), such as a bottom plate of this storage capacitor structure, via the electrically conductive structure 60, but not limited thereto.

As shown in FIG. 11 and FIG. 12, the memory device 102 may include the second sidewall structures 50S, the electrically conductive structures 60, and the dielectric layer 62 described above. In addition, the memory device 102 may include the recess RC extending downwards from the top surface TS of the storage node contact structure SC, the recess RC may be formed from the first void V1, and the recess RC may be located in one of the four corner portions of the storage node contact structure SC (such as the corner portions CR illustrated in FIG. 1 and FIG. 2) accordingly. In some embodiments, the width of the recess RC may be less than or equal to the width of the second sidewall structure 50S, and the second sidewall structure 50S may be disposed on the storage node contact structure SC and partially located in the recess RC. The recess RC may be completely filled with the second sidewall structure 50S, and the bottom of the second sidewall structure 50S may be lower than the top of the storage node contact structure SC in the vertical direction D3 accordingly. Additionally, in some embodiments, the width of the recess RC may be greater than the width of the second sidewall structure 50S, and the recess RC may be filled with at least two materials accordingly. For instance, the recess RC may be filled with a part of the second sidewall structure 50S and a part of the electrically conductive structure 60.

To summarize the above descriptions, in the memory device and the manufacturing method thereof according to the present invention, the voids may be formed in the storage node contact structure, and the voids may be located in at least two of the four corner portions of the storage node contact structure for reducing the negative influence of the voids on the storage node contact structure while increasing the manufacturing throughput.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
a semiconductor substrate;
bit line structures disposed on the semiconductor substrate, wherein each of the bit line structures extends in a first direction, and the bit line structures are arranged in a second direction;
isolation structures disposed on the semiconductor substrate, wherein the isolation structures are located between the bit line structures adjacent to one another;
a storage node contact structure disposed on the semiconductor substrate and located between two of the bit line structures adjacent to each other, wherein the storage node contact structure is located between two of the isolation structures adjacent to each other in the first direction, and the storage node contact structure comprises four corner portions; and
first voids disposed in the storage node contact structure, wherein the first voids are located in at least two of the four corner portions respectively, the storage node contact structure comprises an electrically conductive material, and a contour of each of the first voids is partially defined by the electrically conductive material.

2. The memory device according to claim 1, wherein the first voids are located in the four corner portions respectively.

3. The memory device according to claim 1, wherein the first voids are separated from one another.

4. The memory device according to claim 1, further comprising:
a second void disposed in the storage node contact structure and separated from the first voids.

5. The memory device according to claim 4, wherein the second void is larger than each of the first voids.

6. The memory device according to claim 1, wherein each of the four corner portions is disposed and surrounded by one of the two adjacent isolation structures and one of the two adjacent bit line structures.

7. The memory device according to claim 1, wherein each of the four corner portions directly contacts one of the two adjacent isolation structures, and each of the first voids directly contacts one of the two adjacent isolation structures.

8. The memory device according to claim 1, further comprising:
a recess extending downwards from a top surface of the storage node contact structure and located in one of the four corner portions; and
a sidewall structure disposed on the storage node contact structure and partially located in the recess, wherein a bottom of the sidewall structure is lower than a top of the storage node contact structure.

9. The memory device according to claim 8, wherein a width of the recess is greater than a width of the sidewall structure.

10. The memory device according to claim 8, wherein the recess is filled with at least two materials.

11. The memory device according to claim 8, wherein lower surfaces of the sidewall structure are not located in the same level.

12. A manufacturing method of a memory device, comprising:

forming bit line structures on a semiconductor substrate, wherein each of the bit line structures extends in a first direction, and the bit line structures are arranged in a second direction;

forming isolation structures on the semiconductor substrate, wherein the isolation structures are located between the bit line structures adjacent to one another; and forming a storage node contact structure on the semiconductor substrate, wherein the storage node contact structure is located between two of the bit line structures adjacent to each other, and the storage node contact structure is located between two of the isolation structures adjacent to each other in the first direction, wherein first voids are formed in the storage node contact structure, the storage node contact structure comprises four corner portions, and the first voids are located in at least two of the four corner portions respectively, wherein the storage node contact structure comprises an electrically conductive material, and a contour of each of the first voids is partially defined by the electrically conductive material.

13. The manufacturing method of the memory device according to claim 12, wherein a method of forming the storage node contact structure comprises:

performing an epitaxial growth process for forming an electrically conductive epitaxial material on the semiconductor substrate, wherein space surrounded by the bit line structures and the isolation structures is filled with the electrically conductive epitaxial material, and the first voids are formed in the epitaxial growth process; and performing an etching back process to the electrically conductive epitaxial material for forming the storage node contact structure.

14. The manufacturing method of the memory device according to claim 13, wherein at least one of the first voids becomes a recess extending downwards from a top surface of the storage node contact structure after the etching back process.

15. The manufacturing method of the memory device according to claim 14, further comprising:

forming a sidewall structure on the storage node contact structure, wherein the sidewall structure is formed on sidewalls of the two adjacent isolation structures and sidewalls of the two adjacent bit line structures, the sidewall structure is partially located in the recess, lower surfaces of the sidewall structure are not located in the same level, and a bottom of the sidewall structure is lower than a top of the storage node contact structure.

16. The manufacturing method of the memory device according to claim 15, further comprising:

forming an electrically conductive structure on the storage node contact structure, wherein the recess is filled with a part of the sidewall structure and a part of the electrically conductive structure.

17. The manufacturing method of the memory device according to claim 13, wherein a second void is formed in the electrically conductive epitaxial material by the epitaxial growth process, the second void is located in the storage node contact structure after the etching back process, the second void is separated from the first voids, and the second void is larger than each of the first voids.

18. The manufacturing method of the memory device according to claim 12, wherein the first voids are located in the four corner portions respectively, and the first voids are separated from one another.

19. The manufacturing method of the memory device according to claim 12, wherein each of the four corner portions is disposed and surrounded by one of the two adjacent isolation structures and one of the two adjacent bit line structures.

20. The manufacturing method of the memory device according to claim 12, wherein each of the four corner portions directly contacts one of the two adjacent isolation structures, and each of the first voids directly contacts one of the two adjacent isolation structures.

21. A memory device, comprising:

a semiconductor substrate;

bit line structures disposed on the semiconductor substrate, wherein each of the bit line structures extends in a first direction, and the bit line structures are arranged in a second direction;

isolation structures disposed on the semiconductor substrate, wherein the isolation structures are located between the bit line structures adjacent to one another;

a storage node contact structure disposed on the semiconductor substrate and located between two of the bit line structures adjacent to each other, wherein the storage node contact structure is located between two of the isolation structures adjacent to each other in the first direction, and the storage node contact structure comprises four corner portions; and first voids disposed in the storage node contact structure, wherein the first voids are located in at least two of the four corner portions respectively, each of the four corner portions directly contacts one of the two adjacent isolation structures, and each of the first voids directly contacts one of the two adjacent isolation structures.

22. The memory device according to claim 21, wherein the first voids are located in the four corner portions respectively.

23. The memory device according to claim 21, wherein the first voids are separated from one another.

24. The memory device according to claim 21, further comprising:

a second void disposed in the storage node contact structure and separated from the first voids.

25. The memory device according to claim 24, wherein the second void is larger than each of the first voids.

26. The memory device according to claim 21, wherein each of the four corner portions is disposed and surrounded by one of the two adjacent isolation structures and one of the two adjacent bit line structures.

27. The memory device according to claim 21, further comprising:

a recess extending downwards from a top surface of the storage node contact structure and located in one of the four corner portions; and a sidewall structure disposed on the storage node contact structure and partially located in the recess, wherein a bottom of the sidewall structure is lower than a top of the storage node contact structure.

28. The memory device according to claim 27, wherein a width of the recess is greater than a width of the sidewall structure.

29. The memory device according to claim 27, wherein the recess is filled with at least two materials.

30. The memory device according to claim 27, wherein lower surfaces of the sidewall structure are not located in the same level.

* * * * *